United States Patent
Im et al.

(10) Patent No.: US 8,616,930 B1
(45) Date of Patent: Dec. 31, 2013

(54) DEPOSITING APPARATUS AND METHOD FOR MANUFACTURING ORGANIC LIGHT EMITTING DIODE DISPLAY USING THE SAME

(71) Applicant: Samsung Display Co., Ltd., Yongin (KR)

(72) Inventors: Ja-Hyun Im, Yongin (KR); Byung-Hoon Chun, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/677,031

(22) Filed: Nov. 14, 2012

(30) Foreign Application Priority Data

Jun. 15, 2012 (KR) .......................... 10-2012-0064403

(51) Int. Cl.
*H01J 9/00* (2006.01)

(52) U.S. Cl.
USPC .................................. 445/24; 438/34; 427/66

(58) Field of Classification Search
USPC .................................. 445/24; 438/34; 427/66
See application file for complete search history.

(56) References Cited

U.S. PATENT DOCUMENTS

| | | | |
|---|---|---|---|
| 7,557,369 B2 | 7/2009 | Humbs et al. | |
| 7,677,195 B2 | 3/2010 | Lee et al. | |
| 7,906,169 B2 | 3/2011 | Lee et al. | |
| 7,910,919 B2 | 3/2011 | Yang et al. | |
| 8,021,205 B2 | 9/2011 | Lee et al. | |
| 2007/0269587 A1* | 11/2007 | Masuda et al. | 427/66 |
| 2009/0220691 A1 | 9/2009 | Kim | |
| 2010/0123692 A1 | 5/2010 | Kim et al. | |
| 2011/0053300 A1* | 3/2011 | Ryu et al. | 438/34 |
| 2011/0133215 A1 | 6/2011 | Kang et al. | |
| 2012/0098416 A1* | 4/2012 | Cho et al. | 313/504 |
| 2012/0100647 A1 | 4/2012 | Kim et al. | |
| 2012/0105424 A1 | 5/2012 | Lee et al. | |
| 2013/0032829 A1* | 2/2013 | Sung et al. | 257/88 |

FOREIGN PATENT DOCUMENTS

| | | |
|---|---|---|
| JP | 2007-227359 | 9/2007 |
| KR | 10-2007-0007463 | 1/2007 |
| KR | 10-2007-0054871 | 5/2007 |

* cited by examiner

*Primary Examiner* — Mary Ellen Bowman
(74) *Attorney, Agent, or Firm* — Robert E. Bushnell, Esq.

(57) ABSTRACT

A deposition apparatus includes a deposition source emitting a deposition material and an angle control member disposed on both sides of the deposition source and controlling an emission direction angle of the deposition material. The angle control member includes a housing having an internal space opened in an emission direction of the deposition material and a sliding member having a first end which is inserted into the internal space and a second end disposed on an emission path of the deposition material. The sliding member is movable forward and backward in the emission direction of the deposition material along the internal space. A method of manufacturing an organic light emitting diode (OLED) display which uses the deposition apparatus is also disclosed.

14 Claims, 6 Drawing Sheets

DEPOSITING APPARATUS AND METHOD FOR MANUFACTURING ORGANIC LIGHT EMITTING DIODE DISPLAY USING THE SAME

CLAIM OF PRIORITY

This application makes reference to, incorporates the same herein, and claims all benefits accruing under 35 U.S.C. §119 from an application earlier filed in the Korean Intellectual Property Office on the 15 Jun. 2012 and there duly assigned Serial No. 10-2012-0064403.

BACKGROUND OF THE INVENTION

1. Field of the Invention

The present invention relates to a deposition apparatus and a method for manufacturing an organic light emitting diode (OLED) display using the deposition apparatus. More particularly, the present invention relates to a deposition apparatus that controls the emission direction of a deposition material using an angle control method, and a method for manufacturing an OLED display.

2. Description of the Related Art

Among display devices, an organic light emitting display has a wide viewing angle, excellent contrast, and a fast response speed, and thus it has been in the limelight as the next-generation display device.

In general, the organic light emitting display has a structure in which an emission layer is inserted between an anode and a cathode so as to realize colors with a theory that light emission occurs from re-combination of holes and electrons emitted from the anode and the cathode in the emission layer. However, high efficient light emission cannot be acquired with such a structure, and intermediate layers such as an electron injection layer (EIL), an electron transport layer (ETL), a hole transport layer (HTL), and a hole injection layer (HIL) may be selectively additionally inserted between the respective electrodes and the emission layer.

In a flat panel display, such as an organic light emitting diode (OLED) display, a vacuum deposition method is used, and thus metal used as an organic material or an electrode forms a thin film on a flat plate by depositing the corresponding material in a vacuum condition. According to the vacuum deposition method, a substrate on which an organic film is grown is disposed in the vacuum chamber, a fine metal mask (FMM) having a pattern that is the same as a pattern of a thin film to be formed is attached, and the organic material is vaporized or sublimated using a deposition source unit and is thus deposited on the substrate.

During such a vacuum deposition method, a spray angle needs to be controlled according to a characteristic of the deposition material or a pattern of the mask, and the spray angle needs to be controlled so as not to be changed as time passes.

The above information disclosed in this Background section is only for enhancement of an understanding of the background of the invention, and therefore it may contain information that does not form the prior art that is already known in this country to a person of ordinary skill in the art.

SUMMARY OF THE INVENTION

One aspect of the present invention provides a deposition apparatus the can form a uniform thin film by compensating for a deposition angle that is changed as process time is increased.

In addition, another aspect of the present invention provides a method for manufacturing an OLED display that can form a uniform thickness of a deposited thin film by compensating for a constant deposition angle by controlling an angle of an angle control member.

A deposition system according to an exemplary embodiment of the present invention includes a deposition source emitting a deposition material and an angle control member disposed on both sides of the deposition source and controlling an emission direction angle of the deposition material. The angle control member includes a housing having an internal space opened in an emission direction of the deposition material and a sliding member, a first end of which is inserted into the internal space and a second end of which is disposed on an emission path of the deposition material and is movable forward and backward in the emission direction of the deposition material along the internal space.

The deposition source is preferably a linear deposition source, a spray nozzle of which sprays the deposition material and is linearly arranged in a first direction, the angle control member being formed along the first direction.

The deposition source is preferably provided in plural and is arranged side by side in the first direction, the angle control member being disposed between the deposition sources.

The deposition source preferably further includes a driver connected to the sliding member so as to move the sliding member forward/backward in the emission direction of the deposition material.

The driver preferably interworks with sliding members of a pair of angle control members disposed in the outermost edge of the deposition source so as to make the sliding members move forward/backward by the same distance.

The driver preferably interworks with the sliding members of the angle control members disposed between the deposition sources so as to make the sliding members move forward/backward by the same distance.

In the sliding member of the angle control member disposed between the deposition sources, a second end disposed in an emission path of the deposition material is preferably bent in a direction that crosses the movement direction of the sliding member.

A method for manufacturing an OLED display according to another exemplary embodiment of the present invention includes: preparing a deposition source that emits a deposition material; preparing a housing disposed on both sides of the deposition source and having an inner space opened in an emission direction of the deposition material, and an angle control member including a sliding member, a second end of which is disposed on an emission path of the deposition material, and moving forward/backward in the emission direction of the deposition material along the inner space; disposing a substrate so as to be opposite the deposition source and the angle control member; controlling an emission direction angle of the deposition material by moving the sliding member forward or backward with respect to the emission direction of the deposition material; and forming a thin film on the substrate by emitting the deposition material onto the substrate.

The deposition source is preferably provided in plural and is arranged side by side in a first direction, and the angle control member is provided between the deposition sources, and the controlling of the emission direction angle of the deposition material preferably includes moving the sliding members, included in the pair of angle control members disposed in the outermost edge, forward/backward by the same distance.

The deposition source is preferably provided in plural and is arranged side by side in a length direction, and the angle control member is provided between the deposition sources, and the controlling of the emission direction angle of the deposition material preferably includes moving the sliding members of the angle control members disposed between the deposition sources forward/backward the same distance.

The deposition material is preferably an organic material forming an organic emission layer, and the thin film is preferably an organic emission layer.

According to the exemplary embodiments of the present invention, the thickness of the thin film can be uniformly formed. In addition, when process time is increased and thus the deposition angle is changed, the thickness of the thin film can be uniform even by compensating the change of the emission angle.

According to the exemplary embodiments of the present invention, an organic thin film can be uniformly deposited throughout the entire pixel arrangement of the OLED display so that luminance uniformity of each pixel can be improved.

In addition, according to the exemplary embodiments of the present invention, the angle control member can be replaced without stopping the process even though the process condition is changed during the deposition process, thereby improving the manufacturing yield. Furthermore, manufacturing can be simplified and the exemplary embodiments of the present invention can be easily applied to a large-sized substrate manufacturing process, and the manufacturing yield and the deposition efficiency can be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
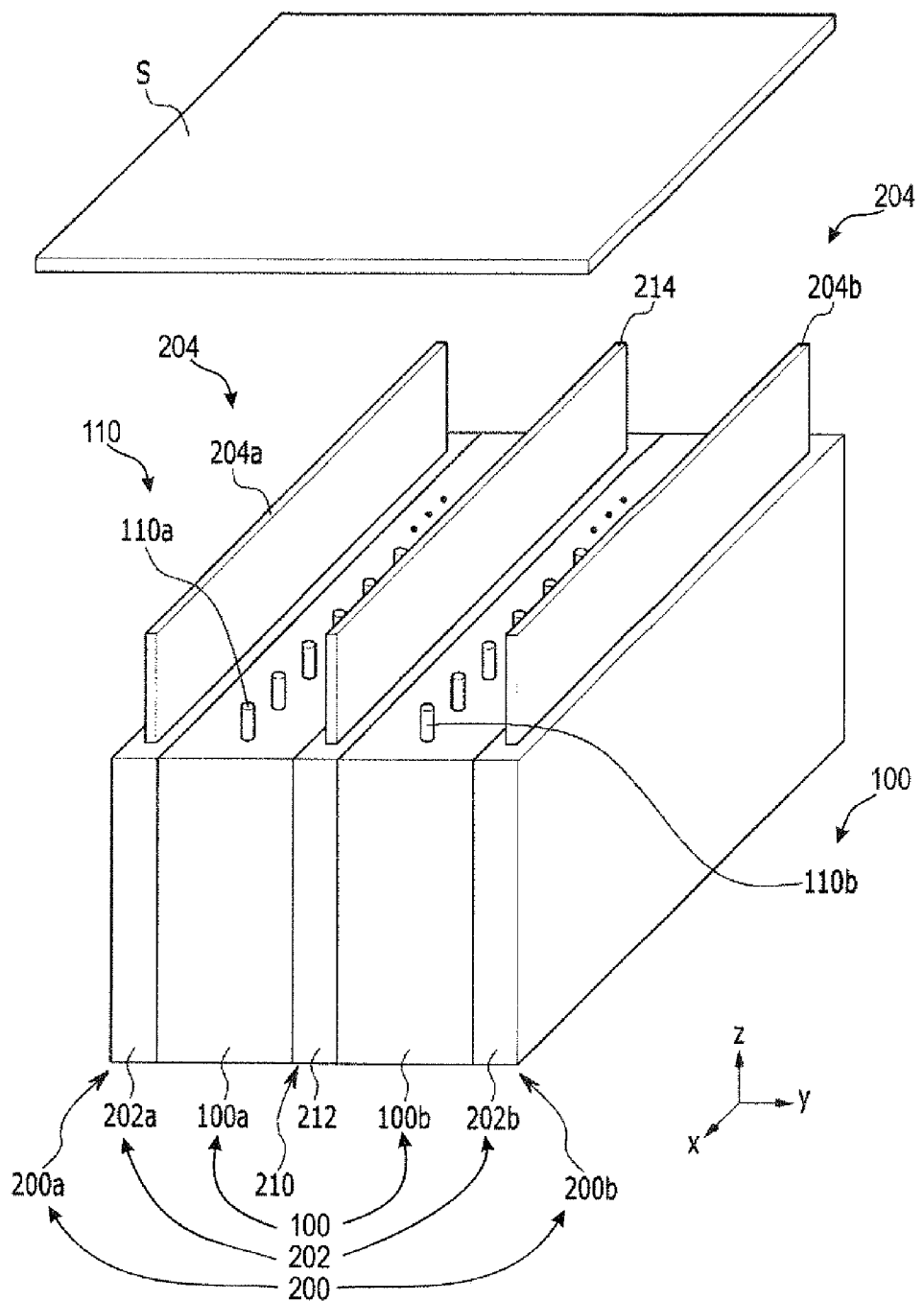
FIG. 1 is a perspective view of a deposition apparatus according to an exemplary embodiment of the present invention.

Hereinafter, a deposition apparatus and a method for manufacturing an OLED display according to exemplary embodiments of the present invention will be described in further detail with reference to the accompanying drawings. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Like reference numerals designate like elements throughout the drawings.

In the drawings, the thickness of layers, films, panels, regions, etc., are exaggerated for clarity. In the drawings, the thicknesses of partial layers and regions are exaggerated for better understanding and ease of description. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that, when an element such as a layer, film, region, or substrate is referred to as being "over" or "on" another element, it can be directly on the other element or intervening elements may also be present.

FIG. 1 is a perspective view of a deposition apparatus according to an exemplary embodiment of the present invention.

Referring to FIG. 1, a deposition apparatus according to the exemplary embodiment of the present invention includes a deposition source 100 (100a and 100b) and a pair of angle control members 200 (200a and 200b).

Although a chamber is not illustrated in each drawing for better understanding and ease of description, the configuration shown in FIG. 1 is provided in a vacuum chamber that maintains a sufficient degree of vacuum. A deposition apparatus and a substrate S, on which a thin film is formed, are provided in the vacuum chamber. The substrate S is disposed opposite the deposition apparatus at a distance therefrom, and the deposition apparatus and the substrate S may be disposed relative to each other while moving relative to each other. When the deposition apparatus is disposed so as to emit a deposition material in a vertical direction, the substrate S may be disposed in parallel with an upper portion of the deposition apparatus, and when the deposition apparatus is disposed so as to emit the deposition material in a horizontal direction, the substrate S may be vertically disposed. In the exemplary embodiment of the present invention, the deposition apparatus is disposed at the bottom side of the vacuum chamber and the substrate S is disposed at a distance in the horizontal direction (i.e. y-axis direction) at the upper side of the deposition apparatus, but the present invention is not limited thereto. The substrate S may be disposed in the vertical direction (i.e., z-axis direction), and thus the deposition apparatus may be disposed at a distance in the horizontal direction from the substrate.

The deposition source 100 is a means for emitting a deposition material so as to deposit the deposition material on the substrate S, and it is provided with a space (not shown) for receiving a deposition material, such as an organic material. The deposition material receiving space may be formed of a ceramic material having an excellent heat emission feature, such as alumina ($Al_2O_3$), aluminum nitride (AlN), and the like, and it is not restrictive. The deposition material receiving space may be formed of various materials having an excellent heat emission feature and heat resistance. A heater (not shown) may be formed so as to surround the external surface of the deposition material receiving space in a closely attached manner, and the heater heats the received deposition material for vaporization of the deposition material. Spray nozzles 110 (110a and 110b) that spray the vaporized or sublimated deposition material from an inner space of the deposition source are disposed on one side of the deposition source 100, facing the substrate S.

The substrate S may be formed in the shape of a rectangular plate for forming of the deposition material, and the deposition source 100 may be formed as a linear deposition source that is linearly arranged in a first direction (x-axis direction) so that the spray nozzles 110 become parallel to one side of the substrate S. As shown in FIG. 1, the spray nozzles 110 may be arranged in a line, but it is not restrictive. The spray nozzles 110 may be arranged in two or more lines. In addition, the deposition source may be provided so as to be plural and arranged in a line, and two deposition sources 100a and 100b are exemplarily arranged side by side in the present exemplary embodiment.

The pair of angle control members 200, respectively arranged on both sides of the deposition source 100, is formed in an emission path of the deposition material emitted from the spray nozzles 110 of the deposition source 100, and functions to control an emission direction of the spray nozzles 110. The deposition material is not sprayed in a straight line in the emission direction but the spray is spread widely in a frontward direction of the emission direction, and therefore the angle control members 200 are disposed on both sides of the spray nozzles 110. The angle control members 200 include housings 202 (202a and 202b) and sliding members 204 (204a and 204b). The housings 202 have a predetermined-sized inner space, and the receiving space is opened in a direction in which the deposition material is emitted. The sliding members 204 are formed in the shape of a plate, and thus one end thereof is inserted in the inner space of the housings 202, and the other end is disposed on the emission path of the deposition material. The sliding members 204 can move forward and backward in the emission direction of the deposition material along the inner space. An emission angle of the deposition material needs to be controlled according to a process condition such as the type of deposition material, a relationship between the deposition source 100 and the substrate S, and an internal pressure of the vacuum chamber. The emission angle of the deposition material can be controlled according to frontward/backward movement of the sliding members 204.

When the deposition sources 100 are extended in the first direction (x-axis direction) and the spray nozzles 110 are arranged along the first direction, the angle control members 200 may be extended in the first direction. That is, the housings 202 of the angle control members 200 may also be extended in the first direction, and the sliding members 204 may be formed in the shape of a plate extended in the first direction.

The deposition sources 100 are provided in plural, and are thus arranged side by side in the first direction. The angle control members 200 may be disposed not only on both sides of the deposition sources 100 but also between the respective deposition sources 100. For example, as shown in FIG. 1, when two deposition sources 100a and 100b are provided, the angle control members 210 may be provided between the two deposition sources 100a and 100b.

Figure 2:
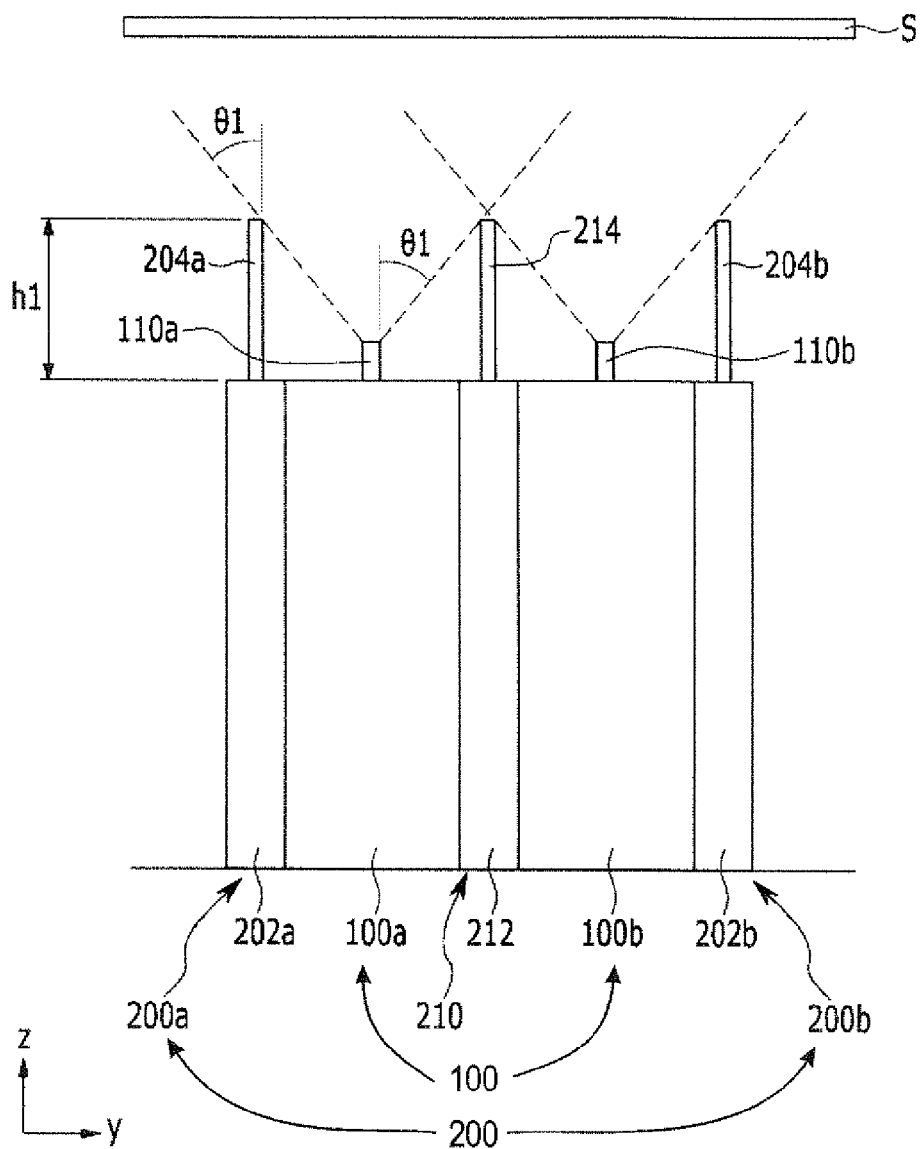
FIG. 2 and FIGS. 3A and 3B are schematic side views of the deposition apparatus according to the exemplary embodiment of the present invention.
Figure 3A:
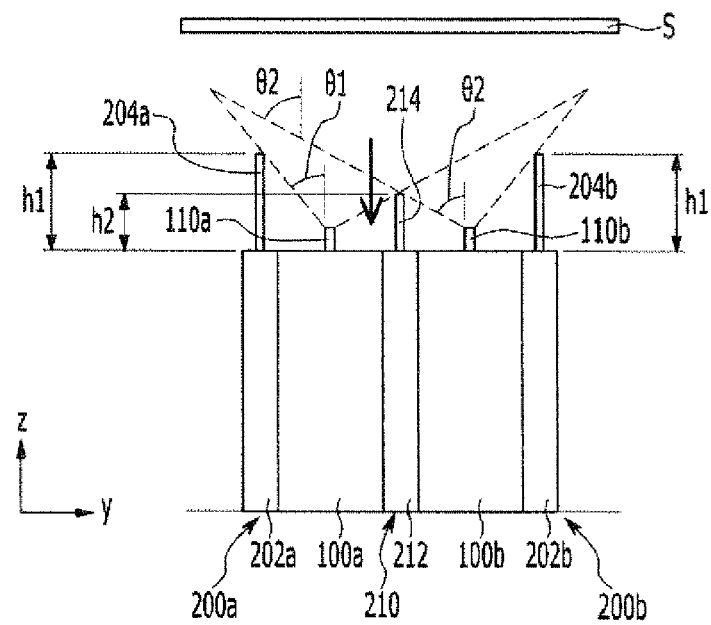
Figure 3B:
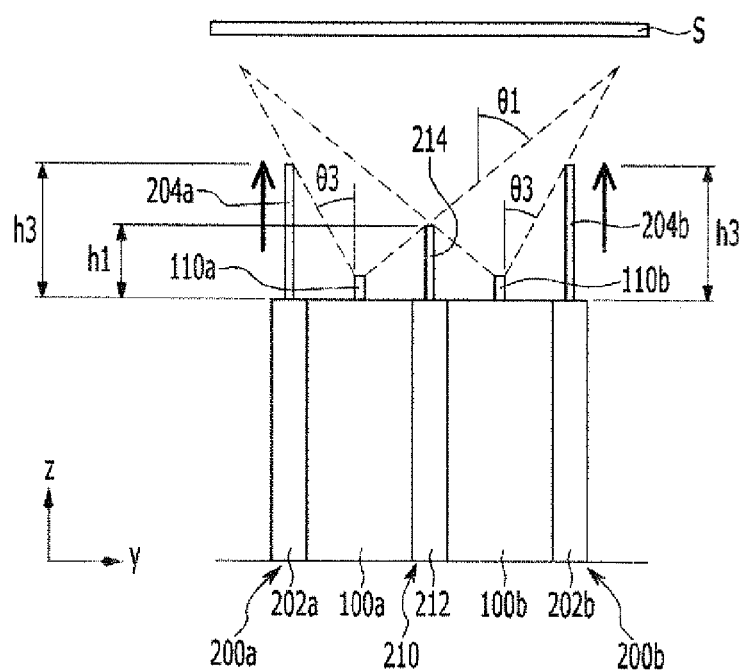

FIG. 2 and FIGS. 3A and 3B are schematic side views of the deposition apparatus according to the exemplary embodiment of the present invention.

As shown in FIG. 2, when sliding members 204a, 204b and 214 are moved forward as much as a height h1 from the deposition sources 100, the deposition material is sprayed with an emission angle of θ1 by the sliding members 204a, 204b, and 214, and is then attached to the substrate S. As shown in FIG. 3A, when the sliding member 214 is moved forward as much as a height h2 (here, h1>h2) in the emission direction of the deposition material, the deposition material is sprayed with an angle of θ2 (here, θ1<θ2) by the sliding member 214, and is then attached to the substrate S. In addition, as shown in FIG. 3B, when the sliding members 204a and 204b are moved forward as much as a height h3 (here, h1<h3) in the emission direction of the deposition material, the deposition material is sprayed with an angle of θ3 (here, θ1<θ3) by the sliding members 204a and 204b, and is then attached to the substrate S. That is, the emission angle of the deposition material is decreased as the sliding members 204a, 204b, and 214 move in the emission direction of the deposition material. As described, the emission angle of the deposition material can be controlled according to forward/backward movement of the sliding members 204a and 204b.

A driver (not shown) connected to the sliding members 204a and 204b so as to move sliding members 204a and 204b forward/backward in the emission direction of the deposition material may be further provided. The driver is formed with such a configuration that it can generate power for linear reciprocal movement of the sliding members 204a and 204b. The driver may linearly move the sliding members 204a and 204b in various manners, such as a ball screw method, a cylinder method, an LM method, and the like, and the present invention is not limited thereto.

When the plurality of deposition sources 100a and 100b are arranged side by side in the first direction, and thus the angle control members 200a and 200b are disposed not only on lateral sides of the deposition sources 100a and 100b but also between the deposition sources 100a and 100b, the driver may be driven, interworking with sliding members 204a and 204b of a pair of angle control members 200a and 200b disposed in the outermost edge of the deposition sources 100 so as to control the sliding members 204a and 204b so that they move by the same distance. As described, the outermost sliding members 204a and 204b interwork with the driver, and thus emission angles of the deposition materials sprayed from the deposition sources 100a and 100b become symmetrical so that the deposition materials can be uniformly deposited. For example, as shown in FIGS. 3A and 3B, when the outermost sliding members 204a and 204b are moved by as much as the height h3, the deposition materials emitted in the outer direction of the deposition sources 100a and 100b may be deposited on the substrate S with the same emission angle of θ3. In addition, the deposition materials sprayed from the deposition sources 100a and 100b may be laterally and symmetrically emitted with reference to the center in the y-axis direction.

Furthermore, the driver may be driven, interworking with the sliding member 214 of the angle control member 210 disposed between the deposition sources 100a and 100b so as to control the sliding member 214 so that it moves by the same distance. As described, when the sliding member 214 between the deposition sources 100a and 100b is interworked, emission angles of deposition materials sprayed from the plurality of deposition sources 100a and 100b become symmetrical so that the deposition materials can be uniformly deposited. In the present exemplary embodiment, two deposition sources 100a and 100b are exemplarily illustrated, but a case in which three or more deposition sources are formed may be the same as the case in which two deposition sources are formed.

Figure 4A:
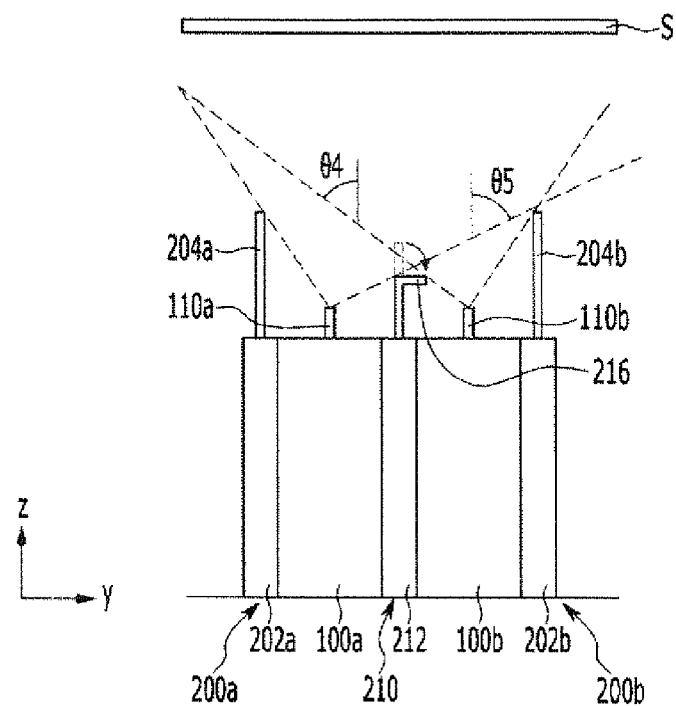
FIGS. 4A and 4B are schematic side views of a deposition apparatus according to another exemplary embodiment of the present invention.
Figure 4B:
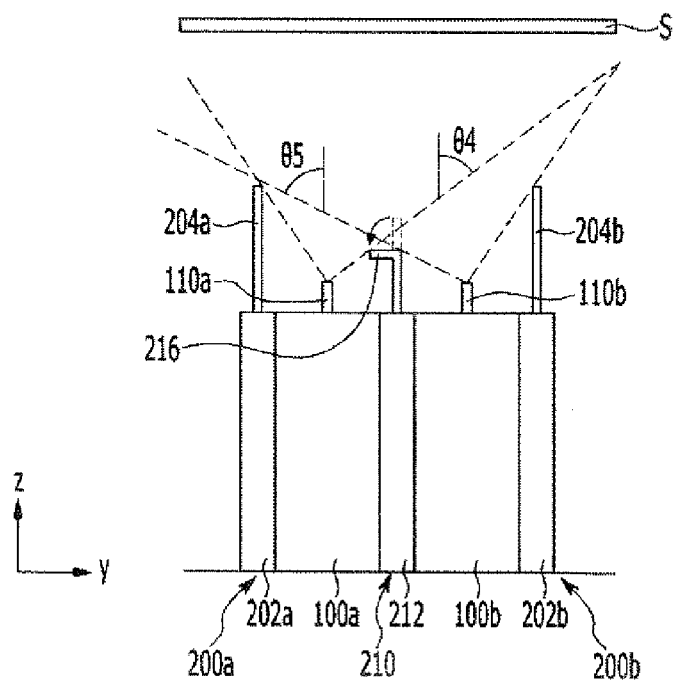

FIGS. 4A and 4B are a schematic side views of a deposition apparatus according to another exemplary embodiment of the present invention.

As shown in FIGS. 4A and 4B, in a sliding member 216 of angle control members 210 disposed between deposition sources 100a and 100b, a second end disposed on an emission path of deposition materials may be bent by a predetermined length in a direction (y-axis) that crosses a movement direction of the sliding member 216. That is, the second end of the sliding member 216 may be bent by the predetermined length in a direction crossing the movement direction of the sliding member 216, centering a first direction as the center axis. When the sliding member 216 is bent, emission angles of deposition materials emitted from adjacent deposition sources 100a and 100b may be different from each other. As shown in FIG. 4A, when the sliding member 216 is bent in a direction of the right side deposition source 100b, a deposition angle θ5 of the left side deposition source 100a becomes larger than a deposition angle θ4 of the right side deposition source 100b. On the contrary, as shown in FIG. 4B, when the sliding member 216 is bent toward the left side deposition source 100a, the deposition angle θ4 of the left side deposition source 100a becomes smaller than the deposition angle θ5 of the right side deposition source 100b. In addition, a difference between the deposition angles of two deposition sources 100a and 100b adjacent to the sliding member 216 may be controlled according to a degree of bending of the sliding member 216.

A thin film may be formed on the substrate S by emitting different deposition materials through a plurality of deposition sources depending on the type of thin film, and in this case, emission angles of the deposition materials emitted from the respective deposition sources should be different from each other. As in the present exemplary embodiment, the emission angles of the deposition materials emitted from the adjacent deposition sources may be set to be different from each other by bending the sliding member 214.

Figure 5:
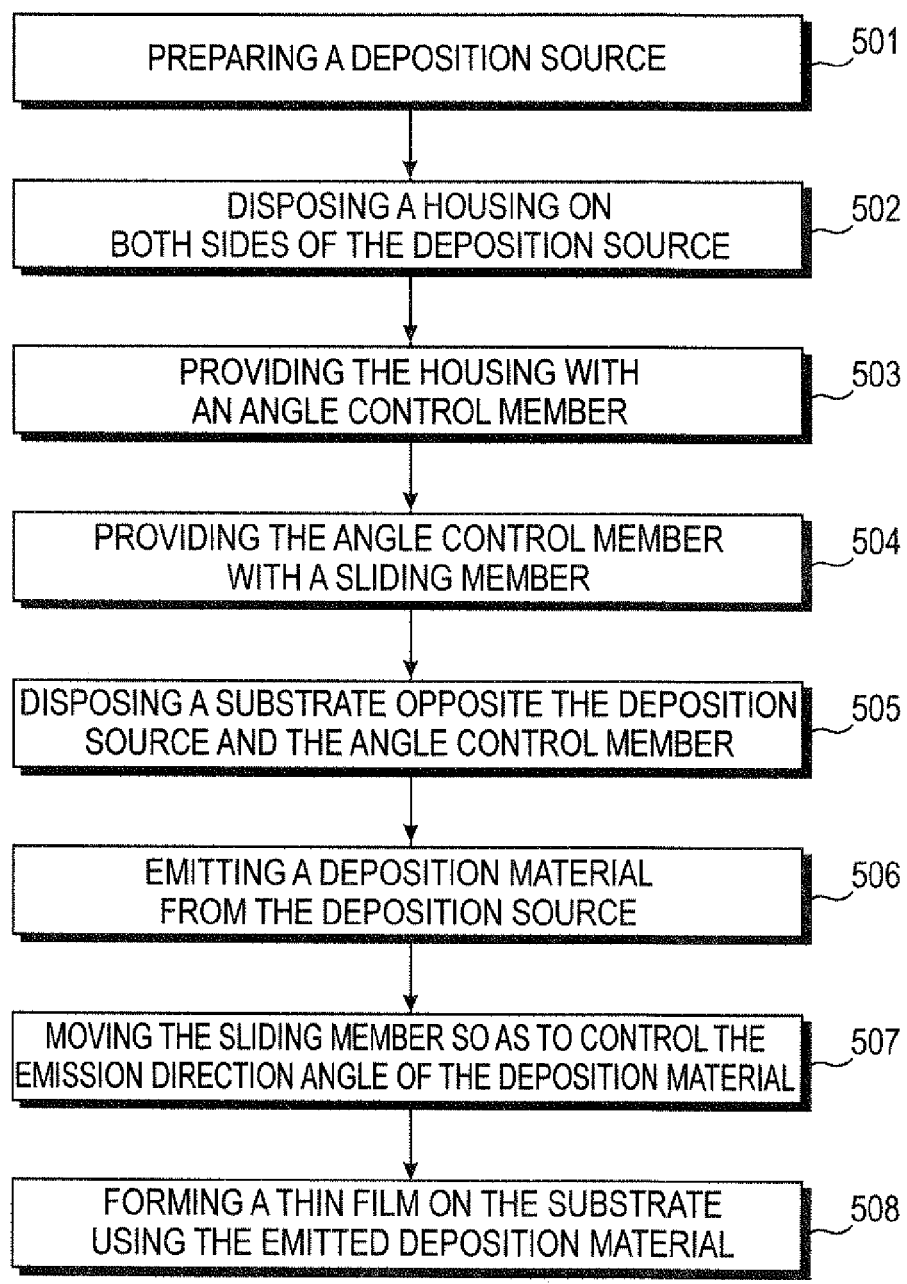
FIG. 5 is a flowchart of a method for manufacturing an OLED display according to the present invention.

The method for manufacturing an OLED display according to the present invention includes: preparing a deposition source that emits a deposition material (FIG. 5, block 501); preparing a housing disposed on both sides of the deposition source and having an inner space opened in an emission direction of the deposition material (FIG. 5, block 502), and an angle control member including a sliding member, a second end of which is disposed on an emission path of the deposition material, and moving forward/backward in the emission direction of the deposition material along the inner space (FIG. 5, blocks 503 and 504); disposing a substrate so as to be opposite the deposition source and the angle control member (FIG. 5, block 505); controlling an emission direction angle of the deposition material by moving the sliding member forward or backward with respect to the emission direction of the deposition material (FIG. 5, blocks 506 and 507); and forming a thin film on the substrate by emitting the deposition material onto the substrate (FIG. 5, block 508).

The deposition source is preferably provided in plural and is arranged side by side in a first direction, the angle control member is provided between the deposition sources, and the controlling of the emission direction angle of the deposition material preferably includes moving the sliding members, included in the pair of angle control members disposed in the outermost edge, forward/backward by the same distance.

The deposition source is preferably provided in plural and is arranged side by side in a length direction, the angle control member is provided between the deposition sources, and the controlling of the emission direction angle of the deposition material preferably includes moving the sliding members of the angle control members disposed between the deposition sources forward/backward the same distance.

The deposition material is preferably an organic material forming an organic emission layer, and the thin film is preferably an organic emission layer.

Hereinafter, operation of a deposition apparatus and a method for manufacturing an organic light emitting diode (OLED) display according to the exemplary embodiment of the present invention will be further described.

Figure 6:
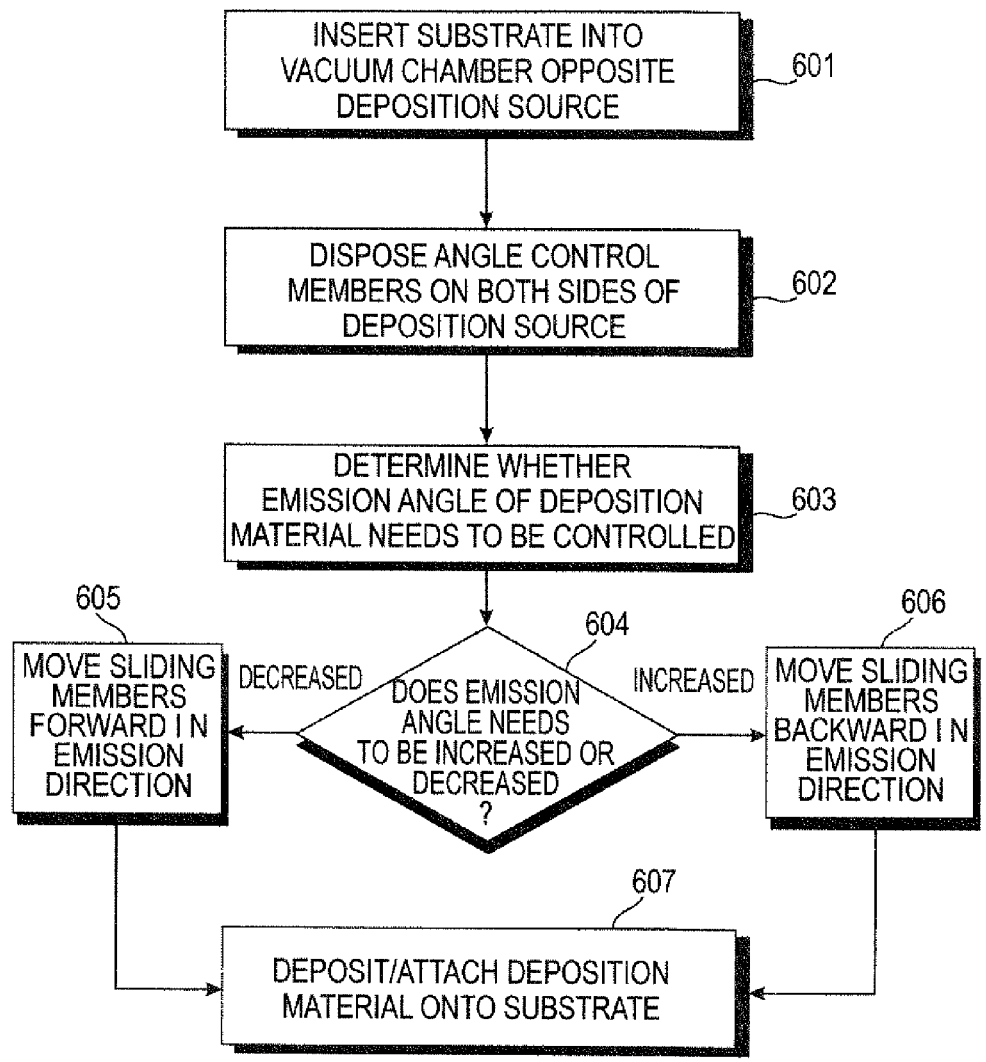
FIG. 6 is a flowchart of the operation of the deposition apparatus of the present invention.

FIG. 6 is a flow chart of the operation of the deposition apparatus of the present invention.

First, the substrate S is inserted into the vacuum chamber (not shown), and the substrate S is disposed in opposition to the deposition source 100 that emits the deposition material (FIG. 6, block 601). In addition, a pair of angle control members 200a and 200b is disposed on both sides of the deposition source 100 (FIG. 6, block 602).

The emission angle of the deposition material may need to be controlled according to deposition process conditions such as the size of the vacuum chamber or the substrate S, a distance between the substrate S and the deposition source 100, and the like, and as previously described, the emission direction angle of the deposition material can be controlled by moving the sliding members 204a, 204b and 214 forward or backward in the emission direction (z-axis) of the deposition material (FIG. 6, blocks 603 and 604).

The emission direction angle of the deposition material can be controlled according to a forward movement distance of the sliding members 204a, 204b and 214. As the sliding members 204a, 204b and 214 move forward in the deposition material emission direction, the emission angle of the deposition material is decreased (FIG. 6, block 605). Conversely, as the sliding members 204a, 204b and 214 move backward in the emission direction, the emission angle is increased (FIG. 6, block 606). The deposition material is then deposited on or attached to the substrate (FIG. 6, block 607).

When controlling the emission angle of the deposition material, the sliding members 214 of the angle control members 210 disposed between the deposition sources 100a and 100b are interworked with each other and then move forward/backward by the same distance, or the sliding members 214 included in a pair of angle control members 210 disposed in the outermost edge are interworked with each other, and then move forward/backward by the same distance.

As shown in FIG. 3A, when the sliding member 214 of the angle control member 210 disposed between the deposition sources 100a and 100b moves backward from the height h1 to the height h2 (herein, h1>h2) in the deposition material emission direction from the deposition source 100, the emission angle of the deposition material is increased from θ1 to θ2 by the sliding member 214 (FIG. 6, block 606). In addition, as shown in FIG. 3B, when the sliding members 214 included in the pair of angle control members 210 disposed in the outermost edge move forward from the height h1 to the height h3 (herein, h1<h3) in the deposition material emission direction from the deposition source 100, the deposition material is sprayed with an emission angle of θ3 (θ1<θ3) by the sliding members 204a and 204b and is then attached to the substrate S (FIG. 6, block 607).

The deposition material is preferably an organic material that forms a sub-pixel, that is, an organic emission layer that expresses a red color R, a green color G, and a blue color B.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus, comprising:
   a deposition source emitting a deposition material; and
   an angle control member disposed on both sides of the deposition source and controlling an emission direction angle of the deposition material;
   wherein the angle control member comprises:

a housing having an internal space opened in an emission direction of the deposition material; and a sliding member having a first end which is inserted into the internal space and a second end which is disposed on an emission path of the deposition material and which is movable forward and backward in an emission direction of the deposition material along the internal space.

2. The deposition apparatus of claim 1, wherein the deposition source is a linear deposition source having a spray nozzle which sprays the deposition material and which is linearly arranged in a first direction, and wherein the angle control member is formed along the first direction.

3. The deposition apparatus of claim 2, further comprising an additional deposition source disposed side by side in the first direction with the deposition source, wherein the angle control member is disposed between the deposition source and the additional deposition source.

4. The deposition apparatus of claim 3, further comprising a driver connected to the sliding member so as to move the sliding member forward and backward in the emission direction of the deposition material.

5. The deposition apparatus of claim 4, wherein the driver interworks with sliding members of a pair of angle control members disposed at an outermost edge of the deposition source so as to make the sliding members move forward and backward by a same distance.

6. The deposition apparatus of claim 4, wherein the driver interworks with the sliding member of the angle control member disposed between the deposition source and the additional deposition source so as to make the sliding member move forward and backward by a same distance.

7. The deposition apparatus of claim 3, wherein, in the sliding member of the angle control member disposed between the deposition source and the additional deposition source, the second end which is disposed in the emission path of the deposition material is bent to a direction that crosses a movement direction of the sliding member.

8. The deposition apparatus of claim 1, further comprising a driver connected to the sliding member so as to move the sliding member forward and backward in the emission direction of the deposition material.

9. The deposition apparatus of claim 8, wherein the driver interworks with sliding members of a pair of angle control members disposed at an outermost edge of the deposition source so as to make the sliding members move forward and backward by a same distance.

10. A method for manufacturing an organic light emitting diode (OLED) display, comprising the steps of:

preparing a deposition source that emits a deposition material;

preparing a housing disposed on both sides of the deposition source and having an inner space opened in an emission direction of the deposition material;

providing the housing with an angle control member including a sliding member having a first end which is inserted into the inner space and a second end which is disposed on an emission path of the deposition material, the sliding member being movable forward and backward in an emission direction of the deposition material along the inner space;

disposing a substrate opposite the deposition source and the angle control member;

controlling an emission direction angle of the deposition material by moving the sliding member forward and backward relative to the emission direction of the deposition material; and forming a thin film on the substrate by depositing the deposition material onto the substrate.

11. The method for manufacturing the OLED display of claim 10, further comprising the step of providing an additional deposition source disposed side by side in a first direction with the deposition source;

wherein the angle control member is disposed between the deposition source and the additional deposition source; and wherein the step of controlling the emission direction angle of the deposition material includes moving the sliding member included in the angle control member forward and backward by a same distance.

12. The method for manufacturing the OLED display of claim 10, further comprising the step of providing an additional deposition source disposed side by side in a length direction;

wherein the angle control member is provided between the deposition source and the additional deposition source; and wherein the step of controlling the emission direction angle of the deposition material includes moving the sliding member of the angle control member disposed between the deposition source and the additional deposition source forward and backward by a same distance.

13. The method for manufacturing the OLED display of claim 10, wherein the deposition material is an organic material forming an organic emission layer, and the thin film is an organic emission layer.

14. The method for manufacturing the OLED display of claim 10, further comprising the step of providing a driver connected to the sliding member for moving the sliding member forward and backward relative to the emission direction of the deposition material so as to control the emission direction of the deposition material.

* * * * *